(12) United States Patent
Yang et al.

(10) Patent No.: US 10,408,858 B2
(45) Date of Patent: Sep. 10, 2019

(54) TEST FIXTURE FOR A DISPLAY DEVICE

(71) Applicants: BOE Technology Group Co., Ltd., Beijing (CN); Chengdu BOE Optoelectronics Technology Co., Ltd., Chengdu (CN)

(72) Inventors: Guowen Yang, Beijing (CN); Zhouping Wang, Beijing (CN)

(73) Assignees: BOE Technology Group Co., Ltd., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 92 days.

(21) Appl. No.: 15/827,972

(22) Filed: Nov. 30, 2017

(65) Prior Publication Data

US 2018/0275166 A1 Sep. 27, 2018

(30) Foreign Application Priority Data

Mar. 24, 2017 (CN) .................... 2017 2 0302142 U

(51) Int. Cl.
*G01R 1/04* (2006.01)
*G09G 3/00* (2006.01)
*H01J 9/42* (2006.01)
*H04N 17/04* (2006.01)

(52) U.S. Cl.
CPC ........... *G01R 1/0408* (2013.01); *G09G 3/006* (2013.01); *H01J 9/42* (2013.01); *H04N 17/04* (2013.01)

(58) Field of Classification Search
CPC .......... G01R 1/0408; H01J 9/42; H04N 17/04
See application file for complete search history.

(56) References Cited

U.S. PATENT DOCUMENTS

| | | | |
|---|---|---|---|
| 8,400,177 B2 * | 3/2013 | Chiu .................... | G01R 1/0416 324/760.01 |
| 2015/0313030 A1* | 10/2015 | Ren ....................... | G06F 1/1601 361/679.22 |
| 2015/0330891 A1* | 11/2015 | Yu .......................... | G01N 21/01 356/237.2 |

* cited by examiner

*Primary Examiner* — Jermele M Hollington
*Assistant Examiner* — Alvaro E Fortich
(74) *Attorney, Agent, or Firm* — McAndrews, Held & Malloy, Ltd.

(57) ABSTRACT

The disclosure relates to the field of display devices and discloses a test fixture for a display device. The test fixture includes a fixing component, and a test component arranged detachably from the fixing component, wherein the fixing component includes a fixing component body, and a clamp arranged on the fixing component body to clamp the display device, and the test component is configured to be electrically connected with a circuit board of the display device.

14 Claims, 4 Drawing Sheets

TEST FIXTURE FOR A DISPLAY DEVICE

CROSS-REFERENCE TO RELATED APPLICATIONS

This application claims priority of Chinese Patent Application No. 201720302142.2, filed on Mar. 24, 2017, which is hereby incorporated by reference in its entirety.

FIELD

The present disclosure relates to the field of display technologies, and particularly to a test fixture for a display device.

BACKGROUND

As the sciences and technologies are advancing constantly, there is also a constantly growing demand of consumers for monitors, TV sets, and other display devices, and there are also increasingly frequent updates to the structures, appearances, performances, and other aspects of the display devices, so display device manufacturers need to design and provide display devices of various models as required for their customers, and thus circuit boards of the display devices have different profiles and orientations from each other.

The display devices to be shipped from a factory need to be tested for reliability to guarantee their quality. For a reliability test on some model of display device, the display device being tested is typically lightened using a special test fixture.

SUMMARY

An embodiment of the disclosure provides a test fixture for a display device, the test fixture including a fixing component, and a test component arranged detachably from the fixing component, wherein the fixing component includes a fixing component body, and a clamp arranged on the fixing component body to clamp the display device, and the test component is configured to be electrically connected with a circuit board of the display device.

Optionally the clamp includes a first guider arranged on the fixing component body, two first holders slidably installed on the first guider, first drivers arranged the respective first holders to drive the first holders to move along the first guider, and first locking mechanisms arranged to the respective first holders to lock the first holders in position on the first guider.

Optionally the clamp further includes: a second guider arranged on the first holders; and second holders slidably installed on the second guider; second drivers arranged to the respective second holders to drive the second holders to move along the second guider; and second locking mechanisms arranged to the respective second holders to lock the second holders in position on the second guider; the second guider has a same guide direction as that of the first guider.

Optionally the first locking mechanisms are fastening bolts connected with threads of the first holders, and capable of abutting against an upper surface of the fixing component body, and the second locking mechanisms are fastening bolts connected with threads of the second holders, and capable of abutting against upper surfaces of the first holders.

Optionally the first locking mechanisms are electromagnetic locks arranged on bottoms of the first holders and are absorbed by and fixed on the fixing component body after being powered on, and the second locking mechanisms are electromagnetic locks arranged on bottoms of the second holders and are absorbed by and fixed on the first holders after being powered on.

Optionally there are at least two second guiders arranged on each first holder.

Optionally the surfaces of the first holders and the second holders for contacting with the display device are rubber surfaces.

Optionally the surfaces of the first holders and the second holders for contacting with the display device are plastic surfaces.

Optionally the first drivers and the second drivers are lead-screw mechanisms.

Optionally the first drivers and the second drivers are worm and gear mechanisms.

Optionally a shortest distance between the second holders is less than a shortest distance between the first holders.

Optionally the fixing component further includes a first sucking disc arranged on the upper surface of the fixing component body between the two first holders.

Optionally the test component further includes a groove configured to accommodate the circuit board of the display device.

Optionally there is a second sucking disc arranged on the inner bottom wall of the groove.

DETAILED DESCRIPTION OF THE EMBODIMENTS

In order to lower a cost of testing a display device, and to improve the efficiency of the test, embodiments of the disclosure provide a test fixture for a display device. In order to make the objects, technical features, and advantages of the disclosure more apparent, the disclosure will be described below in further details in connection with the embodiments thereof.

Figure 1:
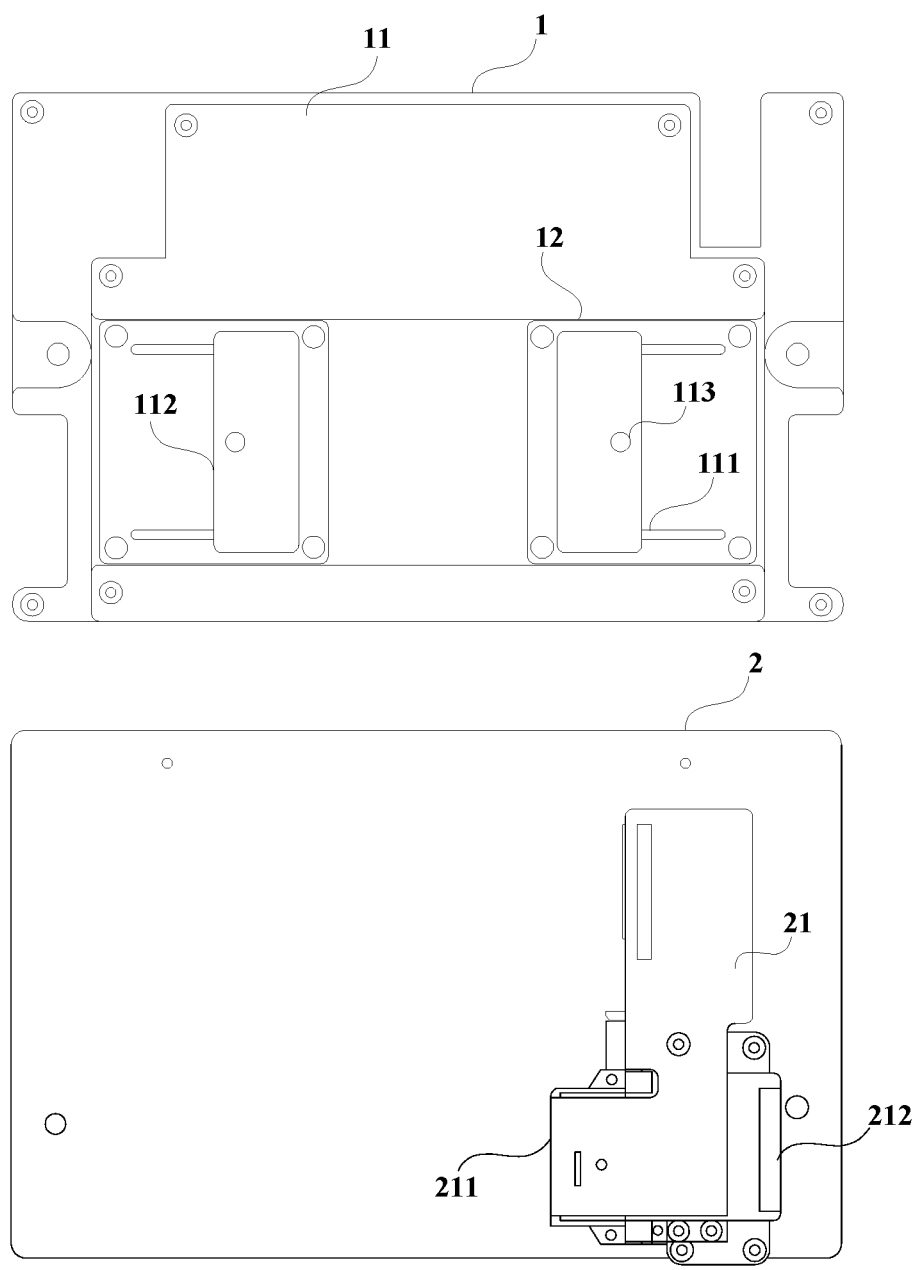
FIG. 1 is a top view of a test fixture according to an embodiment of the disclosure.

As illustrated in FIG. 1, an embodiment of the disclosure provides a test fixture for a display device, which includes a fixing component 1, and a test component 2 arranged detachably from the fixing component 1, where the fixing component 1 includes a fixing component body 11, and a clamp 12 arranged on the fixing component body 11 to clamp the display device, and the test component 2 is configured to be electrically connected with a circuit board of the display device.

The test fixture according to embodiments of this disclosure includes the fixing component configured to fix the display device, and the test component configured to be electrically connected with the circuit board of the display device, where the test component is arranged detachably from the fixing component. The clamp of the fixing component can be adjusted to clamp different models of display devices, and the test component can also be replaced accordingly, so the different models of display devices can be tested using the test fixture. When the model of display device to be tested is changed, only the test component will be replaced with a corresponding test component, thus lowering a cost of testing the display device, and improving the efficiency of the test, as compared with the related art.

In an embodiment of the disclosure, the clamp 12 will not be limited to any particular structural form, for example, the clamp can be a spring clamp or a sliding clamp. As illustrated in FIG. 1, in an optional embodiment of the disclosure, the clamp 12 is a sliding clamp, and the clamp 12 includes a first guider 111 arranged on the fixing component body 11, two first holders 112 slidably installed on the first guider 111, first drivers (not illustrated) arranged correspondingly to the respective first holders 112 to drive the first holders 112 to move along the first guider 111, and first locking mechanisms 113 arranged correspondingly to the respective first holders 112 to lock the first holders 112 in position on the first guiders 111. In this embodiment, the first drivers can drive the first holders 112 to move along the first guiders 111, and the first locking mechanisms 113 can lock the first holders 112 at any positions on the first guiders 111, so the distance between the two first holders 112 in the clamp 12 is adjusted to enable the clamp 12 to clamp different models of display devices.

Figure 2:
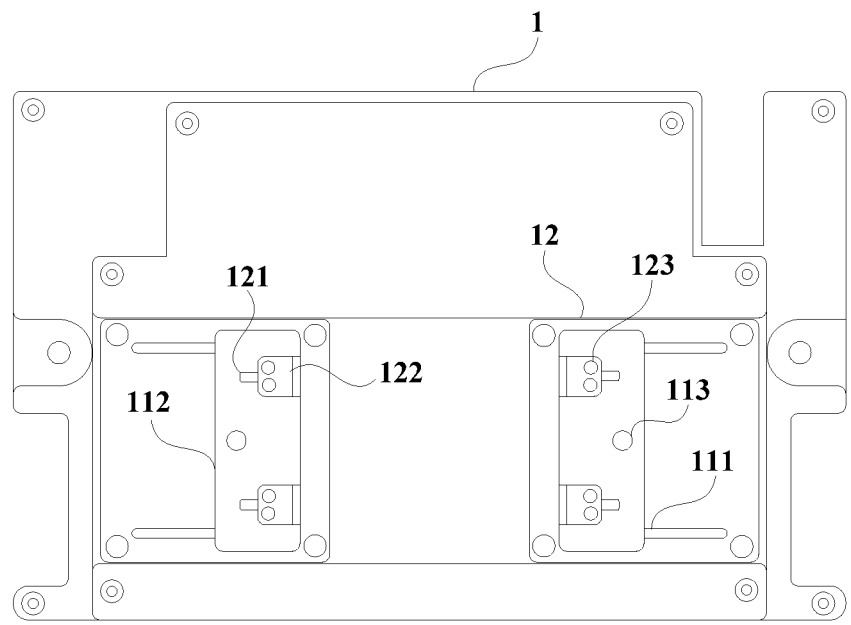
FIG. 2 is a top view of a fixing component according to an embodiment of the disclosure.

As illustrated in FIG. 2, in an embodiment of the disclosure, the clamp 12 is improved over the structural form illustrated in FIG. 1 in that the clamp 12 further includes: a second guider 121 arranged on the respective first holders 112, where the second guider 121 has the same guide direction as that of the first guiders 111; and a second holder 122 slidably installed on the respective second guiders 121; a second driver (not illustrated) arranged corresponding to the respective second holders 122 to drive the second holders 122 to move along the second guiders 121; and a second locking mechanism 123 arranged corresponding to the respective holders 122 to lock the second holders 122 in position on the second guiders 121. In this embodiment, the second drivers can drive the second holders 122 to move along the second guiders 121, and the second locking mechanisms 123 can lock the second holders 122 at any positions on the second guiders 121, so the distance between the two second holders 122 in the clamp 12 is adjusted to enable the clamp 12 to clamp different models of display devices. Optionally the shortest distance between the second holders 122 arranged opposite to each other on the two first holders 112 is less than the shortest distance between the two first holders 112, so that the clamp can clamp a model of display device with a smaller size, and thus the test fixture can be applicable to more models of display devices, thus resulting in higher universality thereof.

In the test fixture according to embodiments of the disclosure, the first locking mechanisms and the second locking mechanisms will not be limited to any particular types, for example, the first locking mechanisms can be fastening bolts connected with threads of the first holders, and capable of abutting against the upper surface of the fixing component body, and the second locking mechanisms can be fastening bolts connected with threads of the second holders, and capable of abutting against the upper surfaces of the first holders; or the first locking mechanism can be electromagnetic locks arranged on the bottoms of the first holders, which are absorbed by and fixed on the fixing component body after being powered on, and the second locking mechanism can be electromagnetic locks arranged on the bottoms of the second holders, which are absorbed by and fixed on the first holders after being powered on. The first locking mechanisms can lock the first holders on the first guiders, and the second locking mechanisms can lock the second holders on the second guiders, so that the first holders and the second holders can be locked from moving while the display device is being tested.

As illustrated in FIG. 2, in an optional embodiment of the disclosure, there are at least two second guiders 121 arranged on each first holder 112, and this design can increase an area where the clamp clamps the display device to thereby improve the reliability of clamping the display device by the clamp.

The surfaces of the first holders and the second holders for contacting with the display device will not be limited to any particular materials, for example, the surfaces thereof can be rubber surfaces or plastic surfaces, and in an optional embodiment of the disclosure, the surfaces of the first holders and the second holders for contacting with the display device are Optionally rubber surfaces, so that the display device can be alleviated from being abraded and scratched by the first holders and the second holders.

In embodiments of the disclosure, the first drivers and the second drivers will not be limited to any particular types, for example, they can be lead-screw mechanisms or worm and gear mechanisms.

Figure 3:
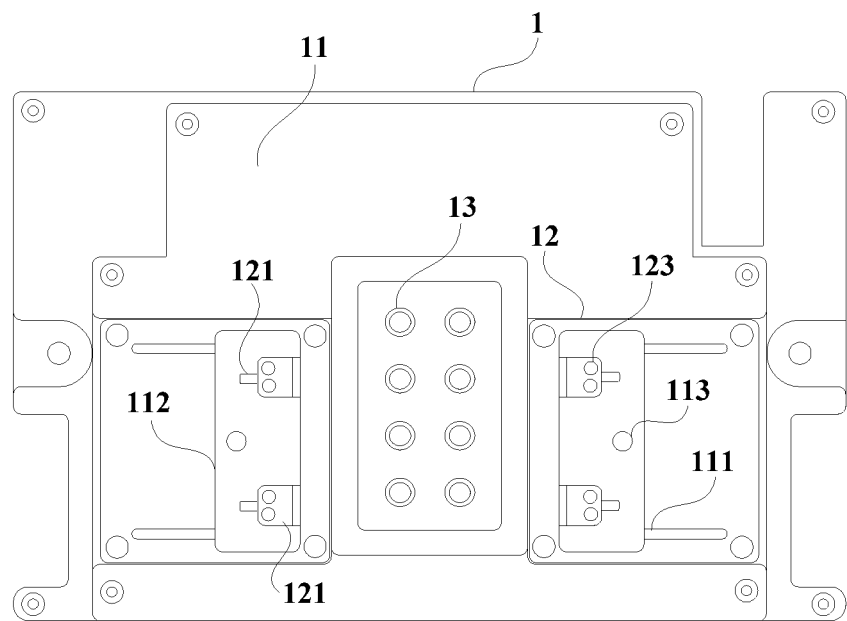
FIG. 3 is a top view of a fixing component according to another embodiment of the disclosure.
Figure 6:
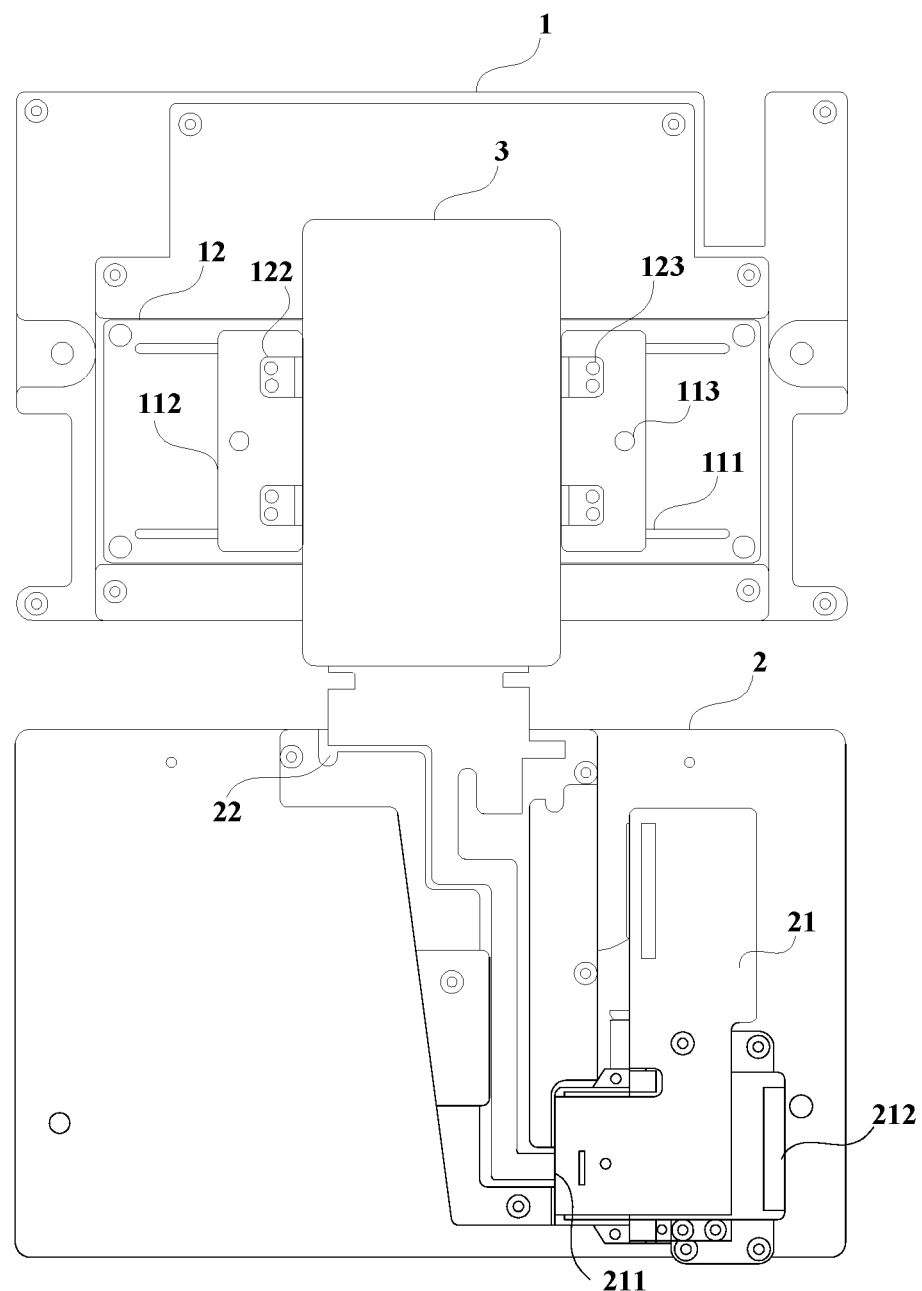
FIG. 6 is a top view of a test fixture according to another embodiment of the disclosure.

As illustrated in FIG. 3 and FIG. 6, in another embodiment of the disclosure, the fixing component 1 further includes a first sucking disc 13 arranged between the two first holders 112 on the upper surface of the fixing component body 11. With this design, the first sucking disc 13 can absorb and fix the display device 3 to thereby improve the reliability of fixation for the display device 3, and alleviate in effect a display screen from being warped.

The test component 2 will not be limited to any particular structural form, and as illustrated in FIG. 1, in an embodiment of the disclosure, the test component 2 includes a connector 21 including a first interface 211 to be electrically connected with the circuit board of the display device, and a second interface 212 to be electrically connected with an external device, so that the circuit board of the display device can be connected with a test signal source for a test.

Figure 4:
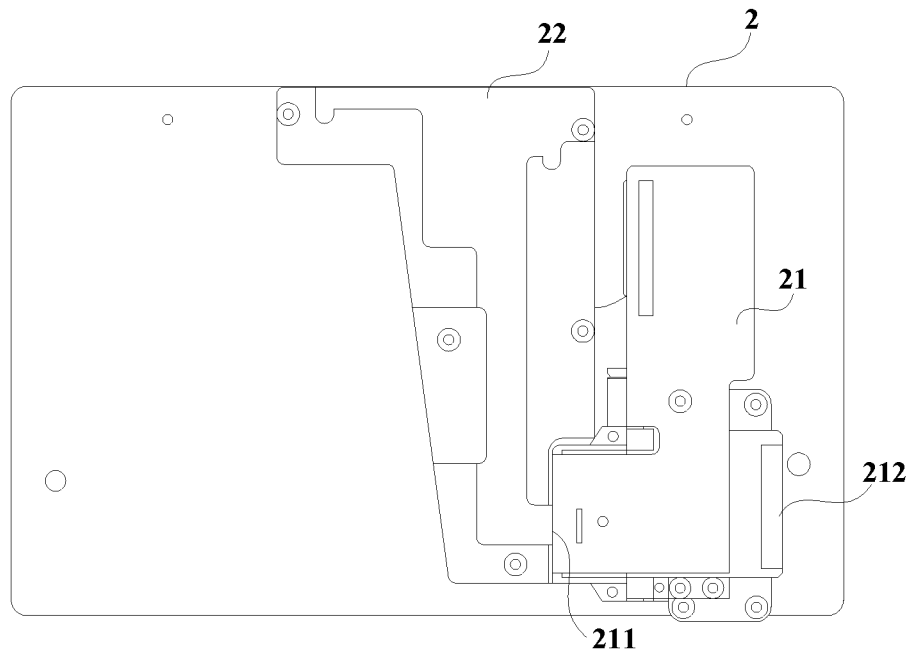
FIG. 4 is a top view of a test component according to an embodiment of the disclosure.

As illustrated in FIG. 4, in an embodiment of the disclosure, the test component 2 is improved over the structural form illustrated in FIG. 1 in that the test component 2 further includes a groove 22 configured to accommodate the circuit board of the display device, and the circuit board of the display device can be placed in the groove, so that the circuit board can be confined in position in the groove 22 to thereby be avoided from being bent and damaged; and the shape of the groove can be designed according to the profile of the circuit board of a varying model of display device.

Figure 5:
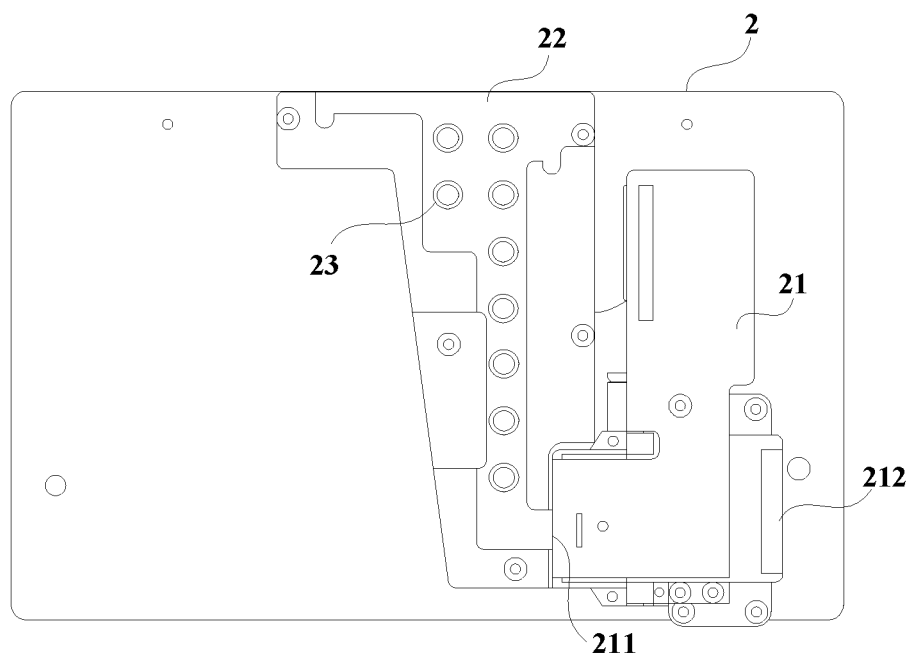
FIG. 5 is a top view of a test component according to another embodiment of the disclosure.

As illustrated in FIG. 5 and FIG. 6, in another embodiment of the disclosure, there is a second sucking disc 23 arranged on the inner bottom wall of the groove 22 to absorb flatly the circuit board of the display device 3, thus alleviating the circuit board from being warped.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A test fixture for a display device, comprises a fixing component and a test component arranged detachably from the fixing component, wherein the fixing component comprises a fixing component body, and a clamp arranged on the fixing component body to clamp the display device, and the test component is configured to be electrically connected with a circuit board of the display device.

2. The test fixture according to claim 1, wherein the clamp comprises a first guider arranged on the fixing component body, two first holders slidably installed on the first guider, first drivers arranged to respective first holders to drive the first holders to move along the first guider, and first locking mechanisms arranged to the respective first holders to lock the first holders in position on the first guider.

3. The test fixture according to claim 2, wherein the clamp further comprises: a second guider arranged on the first holders and second holders slidably installed on the second guider; second drivers arranged to respective second holders to drive the second holders to move along the second guider; and second locking mechanisms arranged to the respective holders to lock the second holders in position on the second guider; wherein the second guider has a same guide direction as that of the first guider.

4. The test fixture according to claim 3, wherein the first locking mechanisms are fastening bolts connected with threads of the first holders, and capable of abutting against a upper surface of the fixing component body, and the second locking mechanisms are fastening bolts connected with threads of the second holders, and capable of abutting against upper surfaces of the first holders.

5. The test fixture according to claim 3, wherein the first locking mechanisms are electromagnetic locks arranged on bottoms of the first holders and are absorbed by and fixed on the fixing component body after being powered on, and the second locking mechanisms are electromagnetic locks arranged on bottoms of the second holders and are absorbed by and fixed on the first holders after being powered on.

6. The test fixture according to claim 3, wherein there are at least two second guiders arranged on each of the first holders.

7. The test fixture according to claim 3, wherein surfaces of the first holders and the second holders for contacting with the display device are rubber surfaces.

8. The test fixture according to claim 3, wherein surfaces of the first holders and the second holders for contacting with the display device are plastic surfaces.

9. The test fixture according to claim 3, wherein the first drivers and the second drivers are lead-screw mechanisms.

10. The test fixture according to claim 3, wherein the first drivers and the second drivers are worm and gear mechanisms.

11. The test fixture according to claim 3, wherein a shortest distance between the second holders is less than a shortest distance between the first holders.

12. The test fixture according to claim 2, wherein the fixing component further comprises a first sucking disc arranged on an upper surface of the fixing component body between the two first holders.

13. The test fixture according to claim 1, wherein the test component further comprises a groove configured to accommodate the circuit board of the display device.

14. The test fixture according to claim 13, wherein there is a second sucking disc arranged on an inner bottom wall of the groove.

\* \* \* \* \*